(12) United States Patent
Hasegawa et al.

(10) Patent No.: US 10,469,078 B2
(45) Date of Patent: Nov. 5, 2019

(54) PROXIMITY SENSOR (71) Applicant: OMRON Corporation, Kyoto (JP)

(72) Inventors: Ryota Hasegawa, Ayabe (JP); Takaaki Sanda, Fukuchiyama (JP)

(73) Assignee: OMRON Corporation, Kyoto (JP)

( * ) Notice: Subject to any disclaimer, the term of this patent is extended or adjusted under 35 U.S.C. 154(b) by 126 days.

(21) Appl. No.: 15/814,404

(22) Filed: Nov. 16, 2017

(65) Prior Publication Data
US 2018/0248546 A1  Aug. 30, 2018

(30) Foreign Application Priority Data

Feb. 27, 2017  (JP) ................... 2017-034526

(51) Int. Cl.
*H03K 17/95* (2006.01)
*H03K 17/94* (2006.01)
*H05B 33/08* (2006.01)
*H05B 37/02* (2006.01)
*G08B 13/14* (2006.01)
*H01F 27/32* (2006.01)

(52) U.S. Cl.
CPC ....... *H03K 17/9505* (2013.01); *H03K 17/941* (2013.01); *H03K 17/9502* (2013.01); *H03K 17/954* (2013.01); *H05B 33/0857* (2013.01); *H05B 37/0227* (2013.01); *G08B 13/1427* (2013.01); *H01F 27/325* (2013.01); *H03K 2017/9507* (2013.01)

(58) Field of Classification Search
CPC ............. H03K 17/9505; H03K 17/941; H03K 17/9502; H03K 17/954; H03K 2017/9507; H03K 17/95; H03K 17/945; H03K 17/943; H03K 17/94; H05B 33/0857; H05B 37/0227; G08B 13/1427; H01F 27/325; F21V 5/00; F21V 5/002; F21V 7/00; F21V 23/004; F21V 2200/00; F21V 2200/15
See application file for complete search history.

(56) References Cited

U.S. PATENT DOCUMENTS

| 6,906,527 | B1* | 6/2005 | Niimi | H01R 13/6683 324/207.15 |
|---|---|---|---|---|
| 7,145,348 | B2* | 12/2006 | Nakazaki | H03K 17/945 324/627 |
| 8,624,585 | B2* | 1/2014 | Mizusaki | H03K 17/9505 29/595 |
| 2006/0059056 | A1* | 3/2006 | Tsuchida | H03K 17/9505 324/207.15 |

FOREIGN PATENT DOCUMENTS

| JP | 2007035583 | 2/2007 |
|---|---|---|
| JP | 2011165323 | 8/2011 |

* cited by examiner

*Primary Examiner* — Bao Q Truong
(74) *Attorney, Agent, or Firm* — JCIPRNET (57) ABSTRACT

To ensure omnidirectional visibility of a proximity sensor with high luminance using a single light emitting element. A proximity sensor (1) includes a substrate (14) on which a control unit (20) is formed and in which a normal direction of the substrate is perpendicular to an axial direction of a coil section (13), a light emitting element (15) which emits light in the axial direction on the substrate, a light diffusion section (16*a*) which diffuses emitted light in a direction other than the axial direction, and a light guide section (16*b*) which guides diffused light to a display section (21) on a side surface.

9 Claims, 5 Drawing Sheets

PROXIMITY SENSOR

CROSS-REFERENCE TO RELATED APPLICATION

This application claims the priority benefits of Japan Patent Application No. 2017-034526, filed on Feb. 27, 2017. The entirety of the above-mentioned patent Applications is hereby incorporated by reference herein and made a part of this specification.

BACKGROUND OF THE DISCLOSURE

Field of the Disclosure

The disclosure relates to a proximity sensor.

Description of Related Art

In proximity sensors in the related art, visibility of approximately 180 degrees has been ensured by mounting an LED (light emitting diode) on one surface of a substrate. In order to ensure omnidirectional visibility, LEDs are required to be mounted on both surfaces of the substrate. In addition, the LED mounted on the substrate is at a distance from a display section and is filled with an opaque epoxy resin. Therefore, it is difficult to visually recognize the display section with high luminance.

For example, Patent Document 1 discloses a configuration of a proximity sensor including a reflecting surface that reflects light emitted from a light emitting element to a display window side which is an end portion on one side. In the configuration of Patent Document 1, omnidirectional visibility cannot be ensured.

PRIOR ART DOCUMENT

Patent Documents

[Patent Document 1] Japanese Unexamined Patent Application Publication No. 2007-035583 (published on Feb. 8, 2007)

[Patent Document 2] Japanese Unexamined Patent Application Publication No. 2011-165323 (published on Aug. 25, 2011)

SUMMARY OF THE DISCLOSURE

According to an exemplary embodiment of the disclosure, there is provided a proximity sensor having a detection coil. The proximity sensor includes a substrate which is provided inside a casing, in which a circuit for signal processing is formed, and in which a normal direction of the substrate is aligned with a direction perpendicular to an axial direction of the detection coil; a light emitting element which is provided on the substrate and emits light in the axial direction of the detection coil; a light diffusion section which diffuses light emitted from the light emitting element in a direction other than the axial direction; and a light guide section which guides light diffused by the light diffusion section to a display section provided on a side surface of the casing.

BRIEF DESCRIPTION OF THE DRAWINGS

FIG. 1(a) and FIG. 1(b) are views illustrating a structure of a proximity sensor according to Embodiment 1 of the disclosure. FIG. 1(a) illustrates the structure of the proximity sensor.

FIG. 2(a) to FIG. 2(c) are views illustrating a detailed structure of the proximity sensor according to Embodiment 1 of the disclosure.

FIG. 3(a) to FIG. 3(d) are views illustrating a structure of a proximity sensor according to Embodiment 2 of the disclosure.

DESCRIPTION OF THE EMBODIMENTS

An object of an exemplary embodiment of the disclosure is to ensure omnidirectional visibility of a proximity sensor with high luminance using a single light emitting element.

A technology of ensuring omnidirectional visibility using a single light emitting element has been proposed. For example, Patent Document 2 discloses a configuration of a proximity sensor that has a tubular light guide section including a first light emitting surface through which light emitted by a light emitting element is transmitted and is directly emitted outward, a reflecting surface which reflects light emitted by the light emitting element and guides the light in a circumferential direction inside the tubular light guide section, and a second light emitting surface through which light reflected by the reflecting surface and propagated in the tubular light guide section is emitted outward.

However, in the proximity sensor of Patent Document 2, the second light emitting surface is limited in size, and it may be difficult to ensure omnidirectional visibility with high luminance.

As in the configuration described above, many proximity sensors are configured to have a substrate which is disposed such that its normal direction is aligned with the direction perpendicular to the axial direction of the detection coil. In such a configuration, when the light emitting element is configured to be simply provided on the substrate, light irradiation can be performed in a direction perpendicular to a surface on which the light emitting element is provided, but light irradiation cannot be performed in a direction toward the back side of the surface on which the light emitting element is provided.

In contrast, according to the configuration described above, the light emitting element can emit light in the axial direction of the detection coil, the light diffusion section can diffuse light in a direction other than the axial direction, and the light guide section can guide light to the display section provided on the side surface of the casing. Thus, it is possible to ensure visibility in a wider range of directions with high luminance using a single light emitting element.

In the proximity sensor according to the aspect of the disclosure, the light guide section includes a plurality of partial light guide sections which guide light in a radial direction from an axis of the detection coil.

According to the configuration, light can be guided multi-directionally. Therefore, light can be visually recognized in multiple directions.

In the proximity sensor according to the aspect of the disclosure, the plurality of partial light guide sections are provided four and disposed at intervals of 90 degrees around the axis.

According to the configuration, light is guided in four directions with equal intervals therebetween. Therefore, light can be visually recognized in all directions.

In the proximity sensor according to the aspect of the disclosure, a wiring which connects the circuit on the substrate to the detection coil is disposed in a region between the partial light guide sections adjacent to each other.

According to the configuration, light can be guided while avoiding the wiring.

In the proximity sensor according to the aspect of the disclosure, the light diffusion section is formed of an opaque resin.

According to the configuration, the light diffusion section is formed of an opaque resin. Therefore, light can be effectively diffused.

In the proximity sensor according to the aspect of the disclosure, the light emitting element includes a first light emitting element and a second light emitting element of which emitted color lights are different from each other. The first light emitting element is provided on one surface of the substrate and the second light emitting element is provided on the other surface of the substrate. The light diffusion section includes a first light diffusion section which diffuses light emitted from the first light emitting element in a direction other than the axial direction and a second light diffusion section which diffuses light emitted from the second light emitting element in a direction other than the axial direction. The light guide section includes a first light guide section which guides light diffused by the first light diffusion section to the display section and a second light guide section which guides light diffused by the second light diffusion section to the display section.

According to the configuration, lights from the first light emitting element and the second light emitting element are diffused by the different light diffusion sections and are guided to the display section by the different light guide sections. Therefore, emitted color lights different from each other can be visually recognized clearly.

In the proximity sensor according to the aspect of the disclosure, a light shielding diffusion member is provided between the first light guide section and the second light guide section.

According to the configuration, the light shielding diffusion member is provided between the two light guide sections, so that emitted color lights different from each other are guided to the display section without being mixed. Therefore, emitted color lights different from each other can be visually recognized more clearly.

In the proximity sensor according to the aspect of the disclosure, the first light emitting element emits light toward a fixing member which fixes the wiring, and the second light emitting element emits light toward the detection coil.

According to the configuration, the two light emitting elements emit light in the axial direction of the detection coil and in directions opposite to each other, thereby contributing to guiding the emitted lights to the display section through different paths.

The proximity sensor according to the aspect of the disclosure further includes a hole which is provided in the substrate and through which light diffused by the second light diffusion section passes.

According to the configuration, even when the second light emitting element is provided on the other surface of the substrate, the substrate has the hole through which light passes. Therefore, light emitted from the second light emitting element can travel not only to the side of the other surface of the substrate but also to the side of the one surface of the substrate.

The aspect of the disclosure exhibits an effect of ensuring omnidirectional visibility of the proximity sensor with high luminance using a single light emitting element.

Embodiment 1

Hereinafter, Embodiment 1 of the disclosure will be described in detail based on FIG. 1(*a*) to FIG. 2(*c*).

Figure 1A:
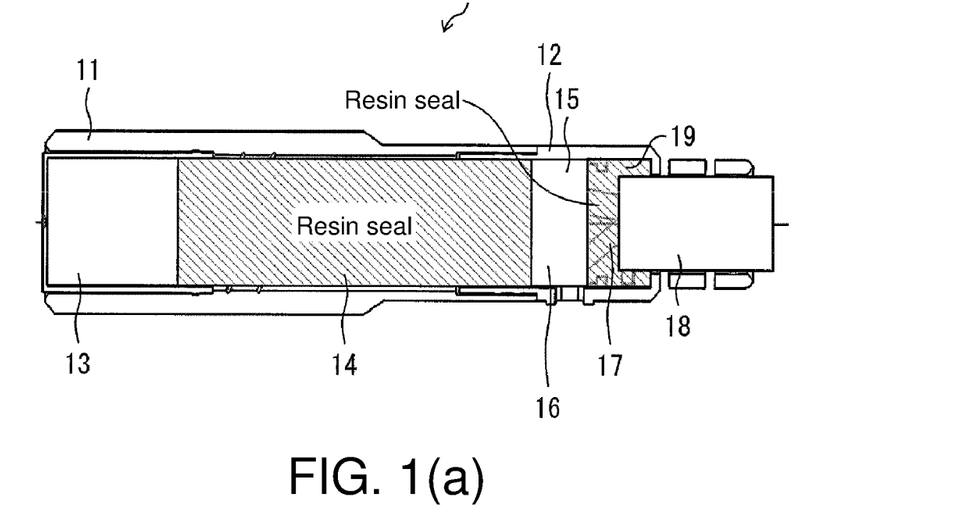
Figure 1B:
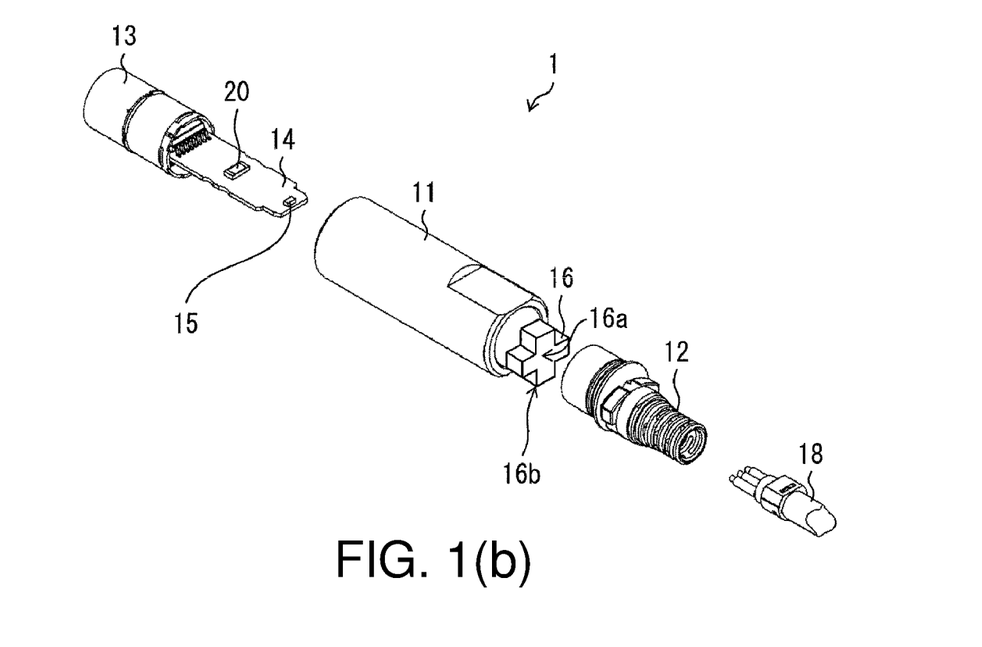
FIG. 1(b) illustrates a configuration of components of the proximity sensor.

FIG. 1(*a*) and FIG. 1(*b*) are views illustrating a structure of a proximity sensor 1 according to the present embodiment. FIG. 1(*a*) is a view illustrating the structure of the proximity sensor 1. FIG. 1(*b*) is a view illustrating a configuration of components of the proximity sensor 1. The proximity sensor 1 detects the presence/absence or a position of a metal body by utilizing a magnetic field.

As illustrated in FIG. 1(*a*), the proximity sensor 1 includes a metal case (casing) 11, a tubular light guide section (casing) 12, a coil section (detection coil) 13, a substrate 14, a light emitting element 15, a cross-shaped light guide path 16, core wires (wirings) 17, a cord (wiring) 18, and a fixing member 19.

As illustrated in FIG. 1(*b*), the proximity sensor 1 is divided into the metal case 11, the tubular light guide section 12, the coil section 13, the substrate 14, the cross-shaped light guide path 16, and the cord 18. The light emitting element 15 and a control unit 20 are mounted in the substrate 14.

The metal case 11 is a cylindrical casing, and its one end is blocked by the coil section 13. The metal case 11 is internally equipped with the substrate 14, the core wires 17, and the like. An opaque resin fills a gap in the metal case 11 in order to fix the constituent components. Epoxy, urethane, acryl, hot melt, rubber, silicone or the like is used for the opaque resin, which is preferably white. Since these resins can diffuse light, they can be employed as a filling member for the proximity sensor 1.

The tubular light guide section 12 fixes the cord 18. A display section 21 which causes light emitted through a window of the cross-shaped light guide path 16 to be emitted outward is disposed in the tubular light guide section 12. The coil section 13 is a circuit for generating a resonance when approaching a metal. The substrate 14 is a substrate which is provided inside the metal case 11, on which the control unit 20 (circuit for signal processing) is formed, and in which a normal direction of the substrate is aligned with a direction perpendicular to an axial direction of the coil section 13.

As illustrated in FIG. 1(*b*), electronic components including the light emitting element 15 and the control unit 20 are mounted on the substrate 14, which is electrically connected to the cord 18. The light emitting element 15 is provided on the substrate 14 while having a light emitting part straight toward the side (parallel to the surface of the substrate 14) and emits light in the axial direction of the coil section 13 in accordance with an instruction from the control unit 20. An LED (light emitting diode) or the like is used for the light emitting element 15. The light emitting element 15 is housed in the cross-shaped light guide path 16.

The cross-shaped light guide path 16 is a cross-shaped combination of four parts and the entirety is covered with an opaque resin or the like. The cross-shaped light guide path 16 houses the light emitting element 15, internally diffuses and reflects light emitted from the light emitting element 15, and guides the light to the display window. The cross-shaped light guide path 16 includes a light diffusion section 16a which diffuses light emitted from the light emitting element 15 in a direction other than the axial direction of the coil section 13 and a light guide section 16b which guides light diffused by the light diffusion section 16a to the display section 21 provided on a side surface of the tubular light guide section 12.

The light guide section 16b includes a plurality of partial light guide sections which guide light in a radial direction from an axis of the coil section 13. As illustrated in FIG. 1(b), there are provided four partial light guide sections disposed at intervals of 90 degrees around the axis of the coil section 13.

The core wires 17 are core wires in the cord 18 and are inserted into the metal case 11 from the other end of the metal case 11 through a resin part which is not the cross-shaped light guide path 16. The cord 18 includes a cable bonded to the substrate 14 through soldering. The cord 18 transmits an electrical signal and supplies power. The fixing member 19 is called a ring cord and fixes the cord 18 including the core wires 17. The fixing member 19 is formed of a resin or the like.

The control unit 20 is a circuit mounted on the substrate 14 and includes a CPU. The control unit 20 has functions of processing a signal transmitted from the coil section 13 and sending an electrical signal to the light emitting element 15 and the cord 18. The display section 21 is disposed on the radial outer side of the tubular light guide section 12. The display section 21 receives light emitted through the window of the cross-shaped light guide path 16 and radiates the received light as diffusive light radially outward from the metal case 11.

Figure 2A:
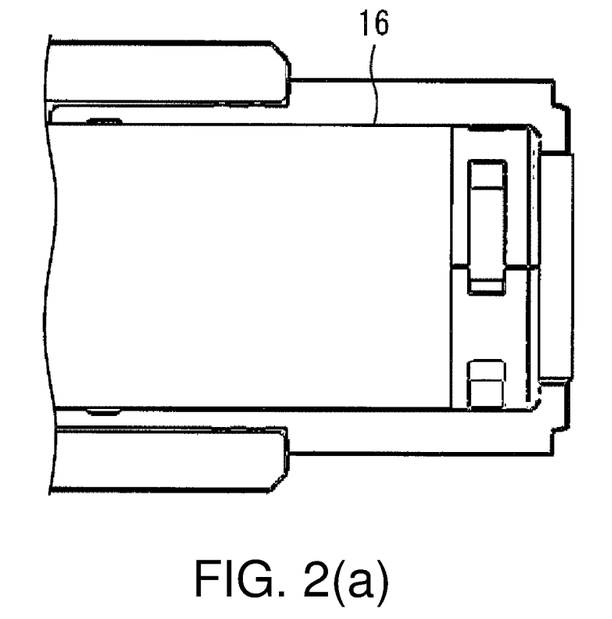
FIG. 2(a) is a side view of the proximity sensor.
Figure 2B:
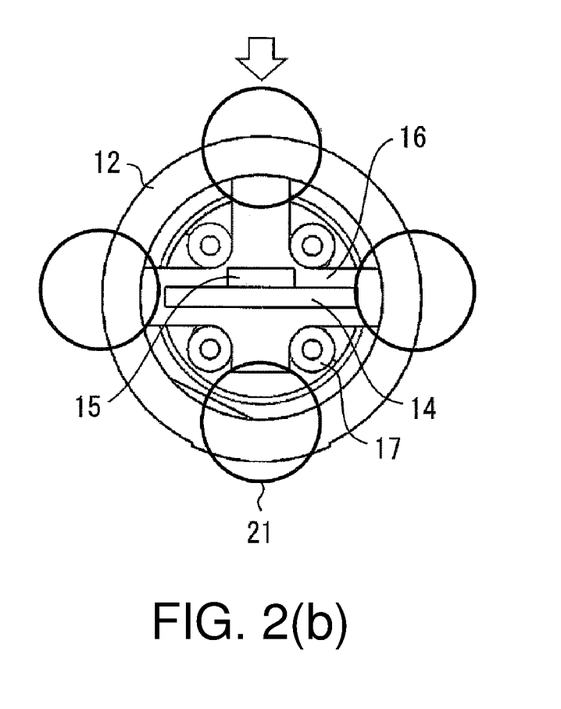
FIG. 2(b) is a cross-sectional view of the proximity sensor.
Figure 2C:
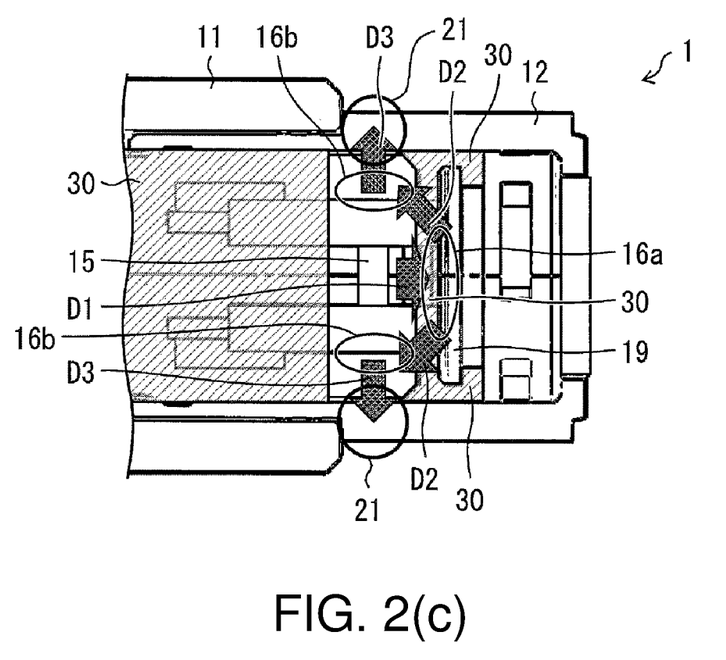
FIG. 2(c) illustrates a direction in which light travels in the proximity sensor.

FIG. 2(a) to FIG. 2(c) are views illustrating a detailed structure of the proximity sensor 1 according to the present embodiment. FIG. 2(a) is a side view of the proximity sensor 1. FIG. 2(b) is a cross-sectional view the proximity sensor 1. FIG. 2(c) is a view illustrating a direction in which light travels in the proximity sensor 1 and is a view of the proximity sensor 1 seen in the direction of the arrow in FIG. 2(b).

As illustrated in FIG. 2(a), an opaque resin fills the inside of the proximity sensor 1.

As illustrated in FIG. 2(b), the core wire 17 connecting the control unit 20 on the substrate 14 to the coil section 13 is disposed in a region between the partial light guide sections adjacent to each other. That is, the cross-shaped light guide path 16 having four partial light guide sections is formed while avoiding the four core wires 17. One end of the substrate 14 is disposed inside the cross-shaped light guide path 16, and the light emitting element 15 is mounted on the upper surface of the substrate 14. Four display sections 21 are disposed every 90 degrees in the tubular light guide section 12 so as to correspond to the cross-shaped light guide path 16.

The light guide path is configured to be shaped according to a number corresponding to the number of core wires 17. For example, when two core wires are provided, the shape of the light guide path becomes a column itself. In addition, where three core wires are provided, the light guide path has a three-pronged columnar shape.

As illustrated in FIG. 2(c), the light diffusion section 16a is filled with an opaque resin 30. The inside of the metal case 11 is also filled with the opaque resin 30.

The light emitting element 15 emits light in an axial direction D1 of the coil section 13 toward the fixing member 19. Next, the light diffusion section 16a of the cross-shaped light guide path 16 diffuses light emitted from the light emitting element 15 in a direction other than the axial direction D1 of the coil section 13 (for example, a direction D2). The light guide section 16b of the cross-shaped light guide path 16 reflects light diffused by the light diffusion section 16a in a radial direction D3 and guides the light to the display section 21. The display section 21 is lit due to light guided by the light guide section 16b.

According to the configuration, in the proximity sensor 1, the light emitting element 15 can emit light in the axial direction of the coil section 13, the light diffusion section 16a can diffuse light in a direction other than the axial direction, and the light guide section 16b can guide light to the display section 21 provided on the side surface of the tubular light guide section 12. Thus, it is possible to ensure visibility in a wider range of directions with high luminance using a single light emitting element 15. Further, since light can be guided multi-directionally, light can be visually recognized in multiple directions. Particularly, since light is guided by the four partial light guide sections in four directions with equal intervals therebetween, light can be visually recognized in all directions.

Then, structural components are added such that the light guide path can be ensured and the core wires 17 can be disposed at a position not blocking a light path of the light emitting element 15. That is, the core wire 17 is disposed in the region between the partial light guide sections adjacent to each other. Therefore, light can be guided while avoiding the core wires 17. Accordingly, the light guide path can cope with four core wires. In addition, since the light diffusion section 16a is formed of an opaque resin, light can be effectively diffused.

According to the description above, workability for a user can be improved, and when the proximity sensor is installed, the user can easily check the operation of a control output.

Other effects will be described below.

(1) When added structural components play a role of a guide which is generally provided in a clamp, the fixing member 19 of the cord 18 can increase in diameter, and it is easy to acquire the UL (Underwriter Laboratories Inc.) mark and the like.

(2) Since the light emitting element 15 is generally mounted on both surfaces of the substrate 14 as 360-degree displaying means, the current consumption increases. However, the present embodiment has an effect of preventing an increase of the current consumption.

(3) When the light emitting element 15 is mounted on both surfaces of the substrate 14, there may be problems of an increase of the number of components and an increase of man-hour. However, the present embodiment has an effect of preventing these problems.

(4) Since the cross-shaped light guide path 16 functions as a guide for the core wires 17, the positional relationship between the light emitting element 15 and a solder land can be made clear, and there is an effect of preventing a disadvantage that the core wires 17 cover the light emitting element 15.

Embodiment 2

Based on FIG. 3(a) to FIG. 3(d), Embodiment 2 of the disclosure can be described as follows. For convenience of description, the same reference signs will be applied to members having the same functions as those of the members described in the above embodiment, and the description thereof will be omitted.

FIG. 3(a) to FIG. 3(d) are views illustrating a structure of a proximity sensor 1a according to the present embodiment.

Figure 3A:
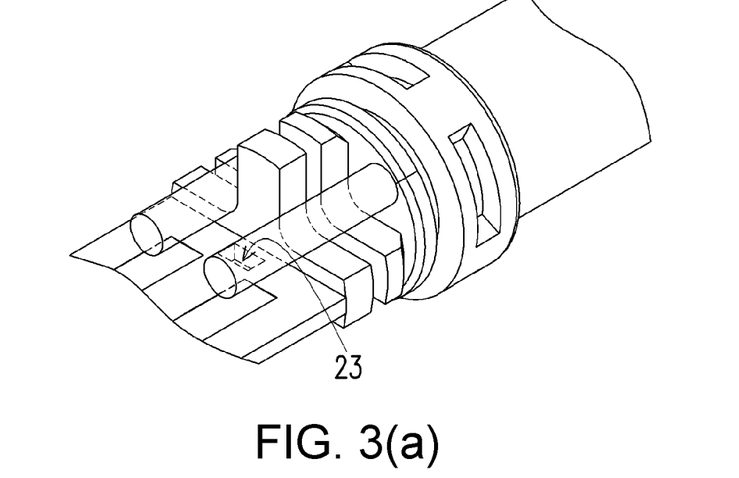
FIG. 3(a) and FIG. 3(b) are perspective views of the proximity sensor.
Figure 3B:
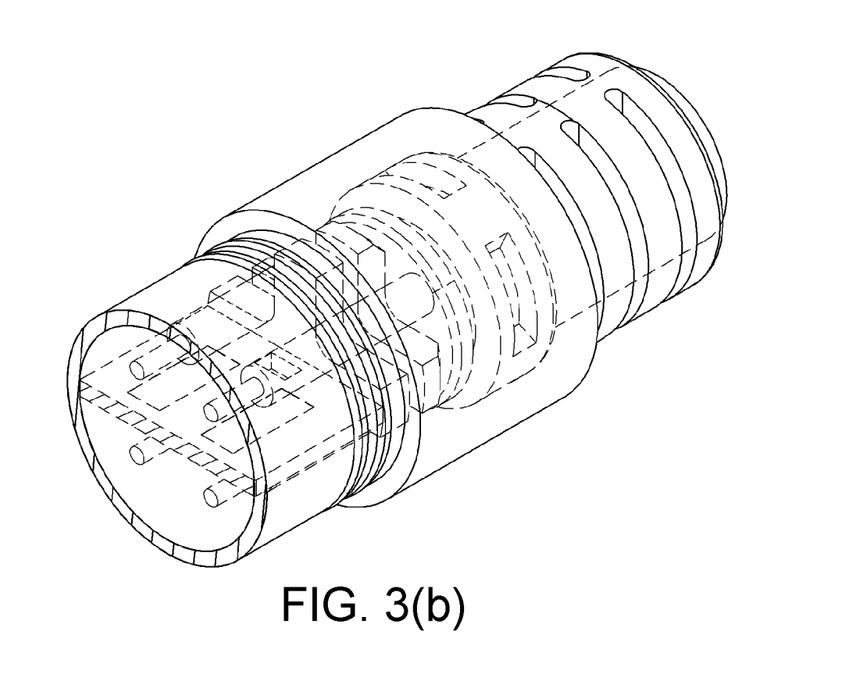
Figure 3C:
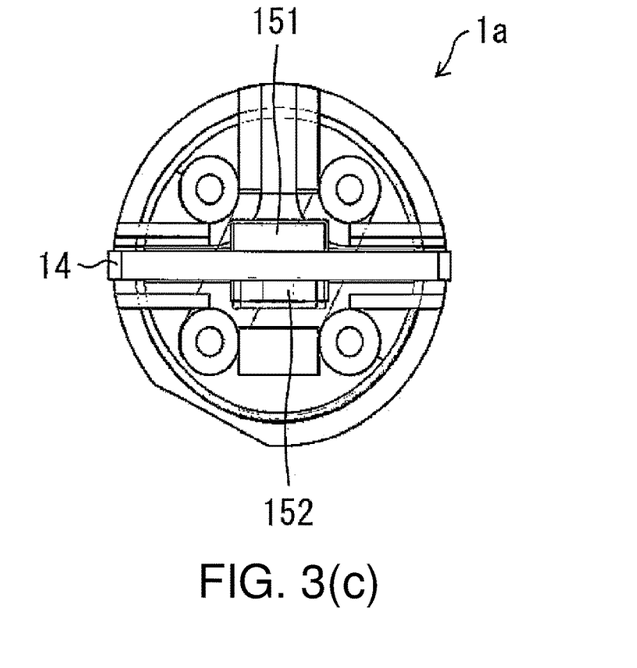
FIG. 3(c) is a cross-sectional view of the proximity sensor.
Figure 3D:
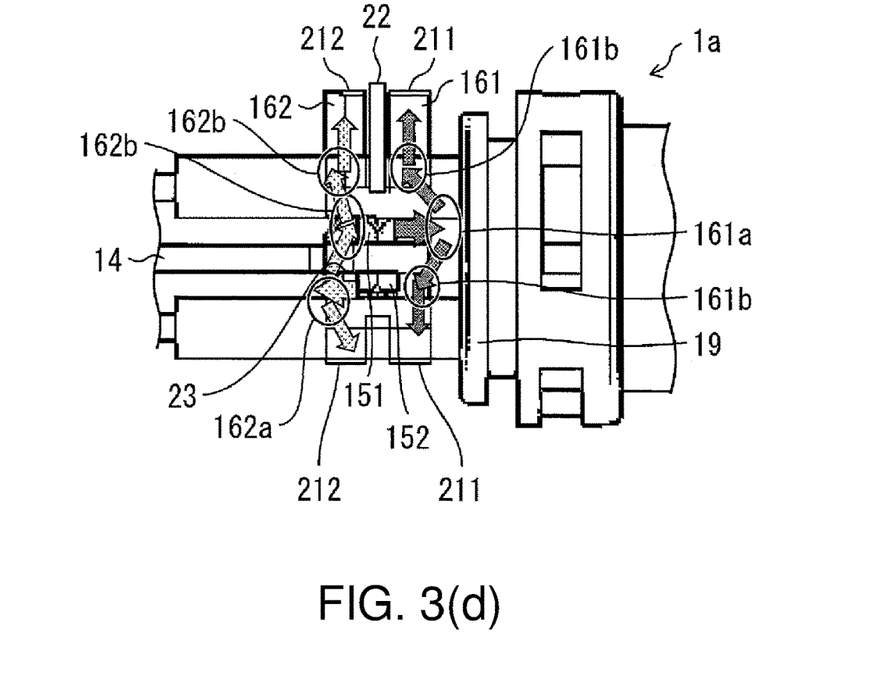
FIG. 3(d) illustrates a direction in which light travels in the proximity sensor.

FIG. 3(a) and FIG. 3(b) are perspective views of the proximity sensor 1a. FIG. 3(c) is a cross-sectional view of the proximity sensor 1a. FIG. 3(d) is a view illustrating a direction in which light travels in the proximity sensor 1a.

As illustrated in FIG. 3(c), the light emitting element includes a light emitting element (first light emitting element) 151 and a light emitting element (second light emitting element) 152 of which emitted color lights are different from each other. The light emitting element 151 is provided on the upper surface (one surface) of the substrate 14. The light emitting element 152 is provided on the lower surface (the other surface) of the substrate 14.

A cross-shaped light guide path 161 houses the light emitting element 151, internally diffuses and reflects light emitted from the light emitting element 151, and guides the light to a display section 211. A cross-shaped light guide path 162 houses the light emitting element 152, internally diffuses and reflects light emitted from the light emitting element 152, and guides the light to a display section 212.

As illustrated in FIG. 3(d), the light emitting element 151 emits green light in the axial direction of the coil section 13 toward the fixing member 19. A light diffusion section (first light diffusion section) 161a of the cross-shaped light guide path 161 diffuses light emitted from the light emitting element 151 in a direction other than the axial direction of the coil section 13. A light guide section (first light guide section) 161b of the cross-shaped light guide path 161 guides light diffused by the light diffusion section 161a to the display section 211.

The light emitting element 152 emits red light in the axial direction of the coil section 13 toward the coil section 13. A light diffusion section (second light diffusion section) 162a of the cross-shaped light guide path 162 diffuses light emitted from the light emitting element 152 in a direction other than the axial direction of the coil section 13.

A portion of light diffused by the light diffusion section 162a travels upward and passes through a hole 23 provided in the substrate 14. A light guide section (second light guide section) 162b of the cross-shaped light guide path 162 guides light which has been diffused by the light diffusion section 162a and has passed through the hole 23 to the display section 212. In addition, a portion of light diffused by the light diffusion section 162a travels downward and is guided to the display section 212.

A light shielding diffusion member 22 having effects of light shielding and light diffusion is provided between the light guide section 161b and the light guide section 162b.

According to the configuration, the emitted lights from the light emitting element 151 and the light emitting element 152 are diffused by the different light diffusion sections 161a and 162a, and the different light guide sections 161b and 162b guide the emitted lights to the display sections 211 and 212. Therefore, the emitted color lights different from each other can be visually recognized clearly.

Since the light shielding diffusion member 22 is provided between the two light guide sections 161b and 162b, the emitted color lights different from each other are guided to the display sections 211 and 212 without being mixed. Therefore, the emitted color lights different from each other can have distinct contrast and can be visually recognized more clearly.

The light emitting element 151 emits light toward the fixing member 19 which fixes the cord 18, and the light emitting element 152 emits light toward the coil section 13. According to the configuration, the two light emitting elements 151 and 152 emit light in the axial direction of the coil section 13 and in directions opposite to each other, thereby contributing to guiding the emitted lights to the display sections 211 and 212 through different paths.

The present embodiment further includes the hole 23 which is provided in the substrate 14 and through which light diffused by the light diffusion section 162a passes. According to the configuration, even when the light emitting element 152 is provided on the other surface of the substrate 14, the substrate 14 has the hole 23 through which light passes. Therefore, light emitted from the light emitting element 152 can travel not only to the side of the other surface of the substrate 14 but also to the side of the one surface of the substrate 14.

Embodiments 1 and 2 have a cable drawn out-type structure. However, a connector-type structure is also included in the scope of the embodiment of the disclosure. Examples of connector-type structures include a type in which a connector pin is soldered as a cable, and a type in which a harness is drawn out from a connector and the harness is soldered on the substrate.

The disclosure is not limited to the embodiments described above, and various changes can be made within the scope described in claims. An embodiment which can be realized by suitably combining technical means disclosed in different embodiments is included in the technical scope of the disclosure.

What is claimed is:

1. A proximity sensor having a detection coil, the sensor comprising:
    a substrate which is provided inside a casing, in which a circuit for signal processing is formed, and in which a normal direction of the substrate is aligned with a direction perpendicular to an axial direction of the detection coil;
    a light emitting element which is provided on the substrate and emits light in the axial direction of the detection coil;
    a light diffusion section in which light emitted from the light emitting element is diffused in a direction other than the axial direction; and
    a light guide section which guides light diffused by the light diffusion section to a display section provided on a side surface of the casing.

2. The proximity sensor according to claim 1,
    wherein the light guide section includes a plurality of partial light guide sections which guide light in a radial direction from an axis of the detection coil.

3. The proximity sensor according to claim 2,
    wherein the plurality of partial light guide sections are provided four and disposed at intervals of 90 degrees around the axis.

4. The proximity sensor according to claim 2,
    wherein a wiring which connects the circuit on the substrate to the detection coil is disposed in a region between the plurality of partial light guide sections adjacent to each other.

5. The proximity sensor according to claim 1,
    wherein the light diffusion section comprises an opaque resin.

6. The proximity sensor according to claim 1,
    wherein the light emitting element comprises a first light emitting element and a second light emitting element, and an emitted color light of the first light emitting element and an emitted color light of the second light emitting element are different from each other, wherein the first light emitting element is provided on one surface of the substrate and the second light emitting element is provided on the other surface of the substrate, wherein the light diffusion section comprises a first light diffusion section which diffuses light emitted from the first light emitting element in a direction other than the axial direction and a second light diffusion section which diffuses light emitted from the second light emitting element in a direction other than the axial direction, and wherein the light guide section comprises a first light guide section which guides light diffused by the first light diffusion section to the display section and a second light guide section which guides light diffused by the second light diffusion section to the display section.

7. The proximity sensor according to claim 6,
wherein a light shielding diffusion member is provided between the first light guide section and the second light guide section.

8. The proximity sensor according to claim 6,
wherein the first light emitting element emits light toward a fixing member which fixes the wiring, and the second light emitting element emits light toward the detection coil.

9. The proximity sensor according to claim 6, further comprising:
a hole which is provided in the substrate and through which light diffused by the second light diffusion section passes.

* * * * *